United States Patent [19]
deBoer et al.

[11] Patent Number: 4,798,165
[45] Date of Patent: Jan. 17, 1989

[54] APPARATUS FOR CHEMICAL VAPOR DEPOSITION USING AN AXIALLY SYMMETRIC GAS FLOW

[75] Inventors: Wiebe B. deBoer, Amersfoort, Netherlands; Klavs F. Jensen, Minneapolis, Minn.; Wayne L. Johnson, Phoenix, Ariz.; Gary W. Read, Chandler, Ariz.; McDonald Robinson, Paradise Valley, Ariz.

[73] Assignee: Epsilon, Tempe, Ariz.

[21] Appl. No.: 147,100

[22] Filed: Jan. 25, 1988

Related U.S. Application Data

[63] Continuation of Ser. No. 784,738, Oct. 7, 1985, abandoned.

[51] Int. Cl.$^4$ .............................................. C23C 16/00
[52] U.S. Cl. .................................... 118/715; 118/725; 118/728; 118/729; 118/730; 427/248.1; 427/255.5
[58] Field of Search ......................... 427/248.1, 255.5; 118/725, 728, 729, 730, 733, 715

[56] References Cited

U.S. PATENT DOCUMENTS

| | | | |
|---|---|---|---|
| 3,745,969 | 7/1973 | Huffman et al. | 118/730 |
| 3,889,632 | 6/1975 | Brunner et al. | 118/730 |
| 3,916,822 | 11/1975 | Robinson | 118/725 |
| 4,013,502 | 3/1977 | Staples | 427/248.1 |
| 4,047,496 | 9/1977 | McNeilly et al. | 118/730 |
| 4,222,345 | 9/1980 | Bergfelt et al. | 118/730 |
| 4,374,162 | 2/1983 | Takagi | 427/248.1 |
| 4,511,593 | 4/1985 | Brandolf | 427/38 |
| 4,540,466 | 9/1985 | Nishizawa | 118/728 |

FOREIGN PATENT DOCUMENTS

85/03460  8/1985  European Pat. Off. ............ 118/729

*Primary Examiner*—Sadie Childs
*Attorney, Agent, or Firm*—David G. Rosenbaum; Harry M. Weiss

[57] ABSTRACT

In a chemical vapor deposition chamber, an improved technique for providing deposition materials to the growth surface is described. The gas carrying deposition materials is constrained to have axial symmetry thereby providing a uniform deposition of materials on the substrate. The gas can be initially directed toward the substrate with a generally uniform perpendicular velocity. The gas can be introduced into the deposition chamber through a multiplicity of apertures and is extracted from the vicinity of the substrate in a manner to preserve the axial symmetry. The apparatus permits convenient control of the deposition process by varying the distance between apparatus introducing the gas carrying the deposition materials and the substrate. The flow of gas minimizes the problems arising from autodoping of the growth layer of material. The flow of gas and generally small size of the deposition chamber minimize particulate contamination of the growing film.

11 Claims, 2 Drawing Sheets

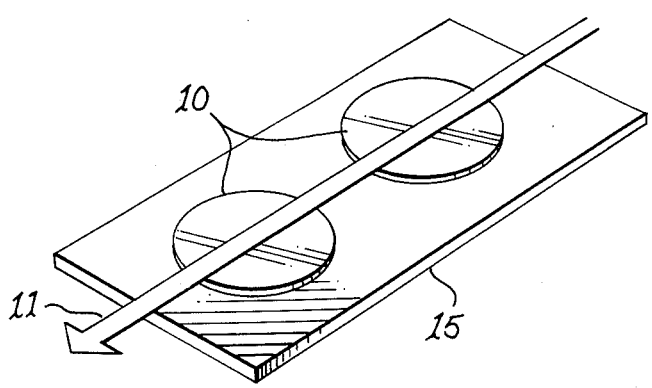
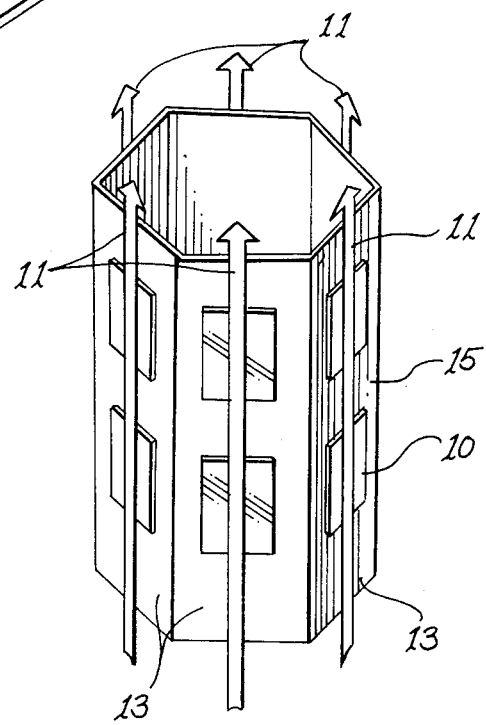
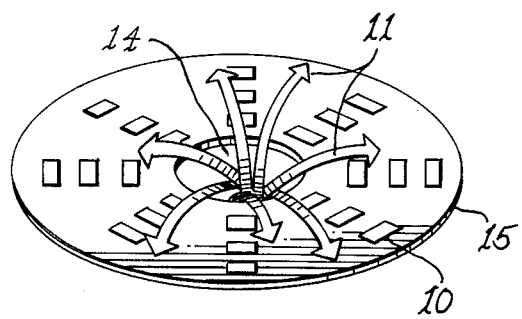
fig.2a
fig.1b
fig.1c
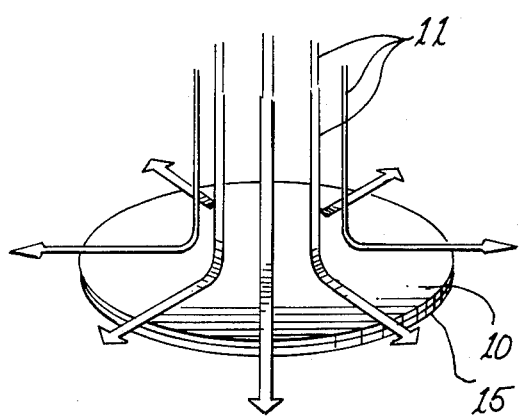
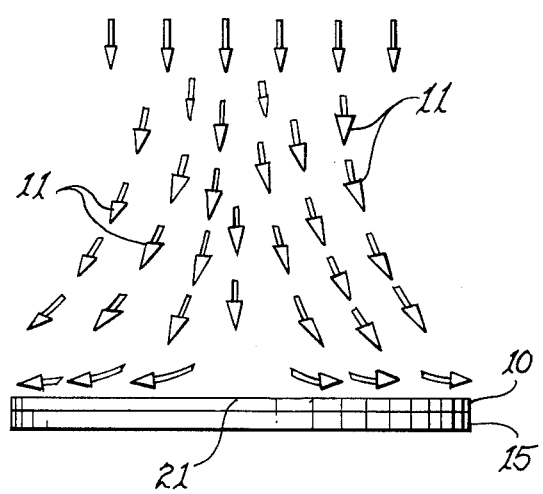
fig.2
fig.3

APPARATUS FOR CHEMICAL VAPOR DEPOSITION USING AN AXIALLY SYMMETRIC GAS FLOW

This is a continuation of application Ser. No. 784,738 filed on Oct. 7, 1985 now abandoned.

BACKGROUND OF THE INVENTION

1. Field of the Invention

This invention relates generally to the chemical vapor deposition of material onto a substrate and, more particularly, to the use of an axially symmetric gas flow for improving the deposition onto a substrate of a material carried by the gas.

2. Discussion of The Related Art

It is known in the related art of chemical deposition of a material onto a substrate, to provide a susceptor in an enclosed container, the susceptor typically supporting a plurality of substrates. A carrier gas, containing gaseous forms of the atoms to be deposited on the substrate, is introduced into the container in the vicinity of the susceptor. The flow of the gas, determined by the geometry of the container and the susceptor, is generally constrained to flow parallel to the substrates. By a combination of transport and chemical reaction, the atoms of the deposition materials adhere at high temperature to the substrate surfaces, forming the desired deposition layer. This deposition technique has proven satisfactory in the part, however as higher volumes of material have been required and higher quality materials needed, limits of this technique are being reached. The deposition technique has four problems. The first problem is that, as the gas flows over the surfaces of the substrates and the susceptor, deposition of the material onto the surface changes the concentration of the deposition materials in the carrier gas. Consequently, over the length of the susceptor, and indeed over the length of each substrate, a different rate of growth of the layer of material is found. A second problem is that, as the deposition material is depleted in the region of deposition, new deposition material must be transported across relatively long distances in the large reaction containers used for deposit. This transport controlled deposition limits the rate at which deposition can occur, and therefore, is related to the cost of the manufacture of the materials such as in the epitaxial process. A third problem is generally referred to as autodoping. In the autodoping process, impurity atoms from the highly doped substrate can be detached from the substrate surface and can be incorporated via the gas phase into the more lightly doped layer of material being deposited. In the related art, special steps must be taken to minimize autodoping, such as deposition of an extra coating onto the back of the substrate. A final problem is particulate contamination. As chemical vapor deposition chambers have become larger, the wall area of the chamber has increased. Unwanted deposits that form upon these walls are sources for particulates that can be inadvertently incorporated into the deposition material.

A need has therefore been felt for a technique of vapor deposition in which the growth rate of the deposited material onto a substrate is highly uniform over the entire area of the substrate, in which the growth rate of the deposited material can be increased, in which autodoping of the deposited material can be prevented without additional process steps, and in which particulate contamination can be minimized.

SUMMARY OF THE INVENTION

It is therefore an object of the present invention to provide method and apparatus for improved chemical vapor deposition of a material onto a substrate.

It is a further object of the present invention to provide a method and apparatus for providing improved chemical vapor deposition of materials, wherein the concentration of the deposition materials in the carrier gas is generally constant over the entire area of the substrate.

It is yet another object of the present invention to provide for chemical vapor deposition of a material onto a substrate wherein the substrate and the flow of the carrier gas have axial symmetry.

It is yet another object of the present invention to provide for chemical vapor deposition of a material onto a substrate using stagnation point flow of the carrier gas.

It is still a further object of the present invention to provide for a uniform flow of vapor directly toward a substrate for purposes of chemical vapor deposition of materials carried by the vapor.

It is yet another object of the present invention to provide, in a chemical vapor growth reaction chamber, a uniform axially symmetric flow of gas toward a circular substrate by having a plurality of apertures through which the carrier gas with the deposition material can pass.

It is still a further object of the present invention to provide for uniform growth rates of material in a chemical vapor reaction chamber by applying an axially symmetric gas flow onto a substrate, and by rotating the substrate.

It is yet another object of the present invention to provide, in a chemical vapor deposition reaction chamber, for the uniform removal of the gaseous products following deposition.

It is still a further object of the present invention to provide, in a chemical vapor deposition reaction chamber, a convenient technique for controlling the rate of deposition of the deposition material on a substrate.

The aforementioned and other objects are accomplished, according to the present invention, by a chemical vapor reaction chamber in which a gas, introduced at a preselected distance from a circular substrate, has an initial uniform velocity toward the substrate. As the gas approaches the substrate, the gas is redirected radially outward in an axially symmetric flow. The gas is withdrawn from the chamber by a multiplicity of apertures, by a series of baffles, or by other means that generally preserve the axial symmetry of the gas flow. The circular substrate can be rotated to provide increased deposition uniformity by averaging irregularities in the gas flow. The distance from the substrate to the apparatus introducing the gas can be varied. In addition, the axial symmetry of the flow of gas reduces the autodoping of the deposited material. The radial flow of gas and the small wall area of the deposition chamber combine to minimize particulate contamination of the growing film.

These and other features of the invention will be understood upon reading of the following description along with the drawings.

BRIEF DESCRIPTION OF THE DRAWINGS

FIG. 1a, FIG. 1b and FIG. 1c are diagrammatic views showing the flow of the gas containing the deposition material over substrates according to typical configurations of the prior art.

FIG. 2 is a schematic diagram, in which the flow of gas is initially directed uniformly toward a circular substrate, according to the present invention.

FIG. 3 is a cross-section diagram of the flow of gas carrying deposition material to the substrate according to the present invention.

DESCRIPTION OF THE PREFERRED EMBODIMENT

Detailed Description of the Figures

Figure 4:
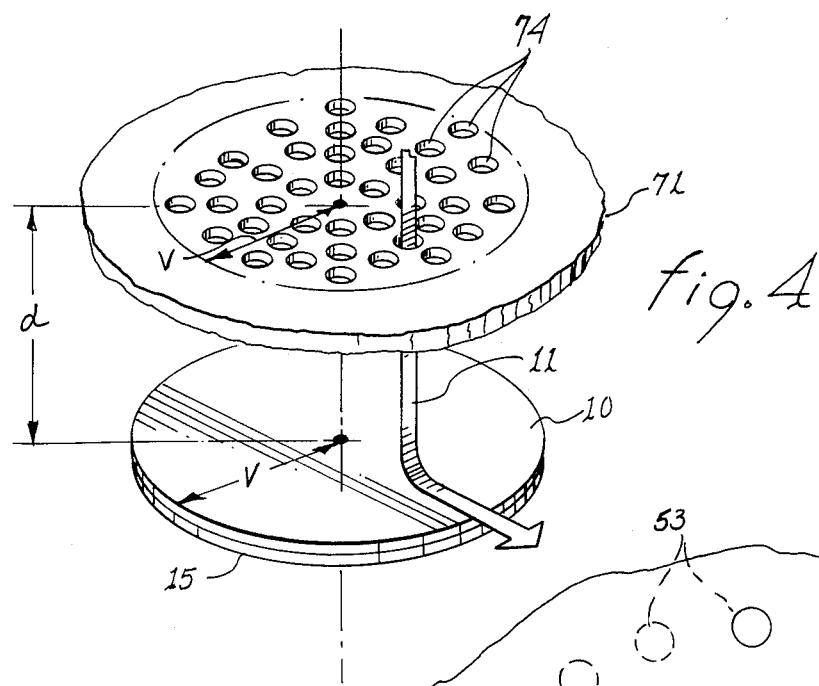
FIG. 4 is a schematic diagram of an apparatus for providing the initial conditions for the flow of gas in FIG. 3.

Referring now to FIG. 1a, a plurality of substrate materials 10 are located on a susceptor material 15. A gaseous substance 11 traverses the substrate material and deposits preselected components of the vapor onto the substrate. FIG. 1b shows a susceptor geometry in which a plurality of surfaces 13 can each support a plurality of substrates 10 for exposure to gas 11 flowing over the surfaces. FIG. 1c shows a geometry in which a susceptor 15 supports a plurality of substrates 10. The gas carrying the deposition material is introduced through an aperture 14 in the center of the susceptor.

Referring next to FIG. 2, a schematic diagram of the instant invention illustrates that gas 11, carrying the vapor deposition material(s), is directed onto a generally circular substrate 10 supported by a susceptor 15. The gas flows first toward the surface, and then in a radially outward direction, away from the axis of the susceptor-substrate combination.

Referring next to FIG. 3, a cross-sectional view in a plane containing the axis of symmetry of the flow of the gas 11 as it approaches the substrate 10 is shown. The gas 11 initially has a generally uniform velocity directed perpendicular to the entire surface of substrate 10. The solid substrate, as the gas 11 approaches the substrate, causes the velocity vector to become parallel to the surface of substrate 20 and flow away from the axis of symmetry. At one point 21 on the axis of symmetry, generally referred to as the stagnation point, there is theoretically no flow of gas. The axially symmetric gas flow resulting from uniform gas flow toward a surface is generally referred to as stagnation point flow.

Referring next to FIG. 4, an implementation of the actual arrangement for providing the initial conditions of a gas with velocity vector with uniform magnitude directed towards the substrate is shown. A surface 71, either a surface of an enclosure or one of two generally parallel plates, has the gas 11 introduced into the region above surface 71. The gas 11 is forced through the apertures 74 in the surface 71 toward the semiconductor substrate 10. Thus, the initial vector of the velocity is directed toward the substrate. Because of the relatively small size of the apertures 74, the magnitude of the gas velocity will generally be uniform among all of the apertures 74 as the gas passes through toward the plane of substrate 10. To reduce the effects of any granularity that can result from the use of discrete apertures, and to smooth out any irregularities in distribution of the gas, the substrate 10 can be rotated during the period of gas flow. It has been found that a generally uniform flow can be obtained when the apertures 74 are located at the apexes of equilateral triangles, and are distributed uniformly over the region of surface 71 approximately the same size as substrate 10 and axially symmetrical therewith.

Figure 5A:
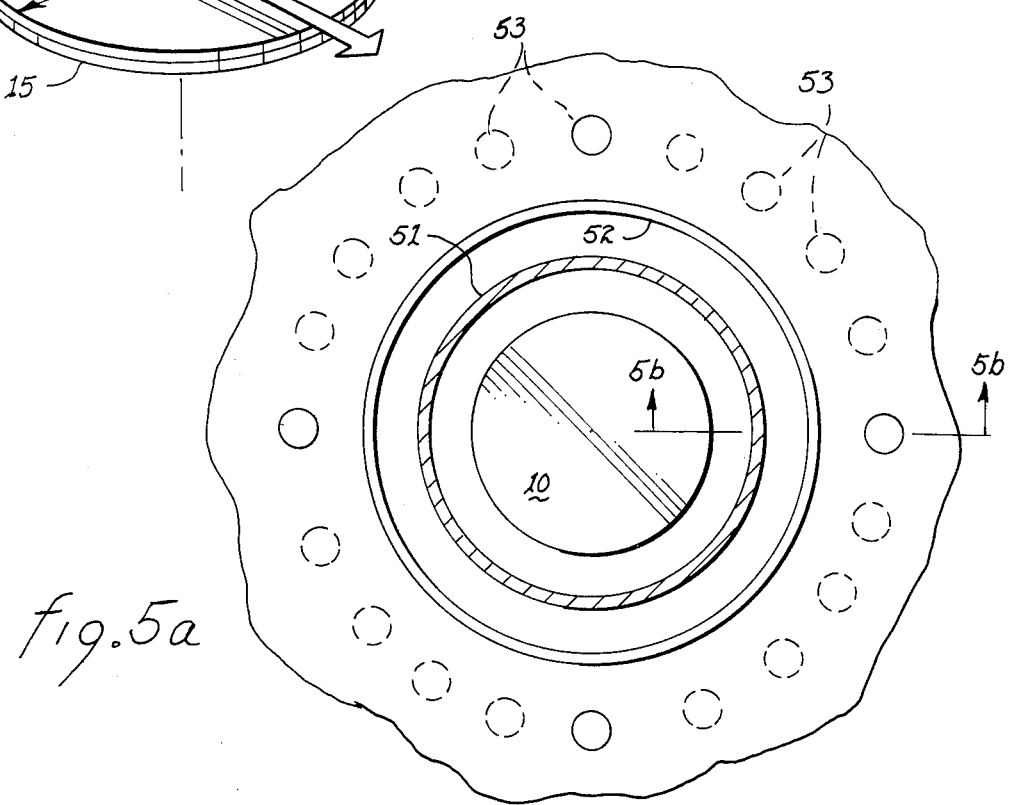
FIG. 5a is a top cross-sectional view of the apparatus showing the position of baffles for maintaining axial symmetry of the flow of gas according to the present invention.
Figure 5B:
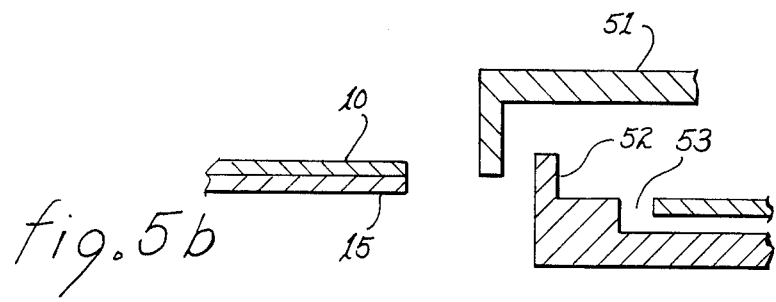
FIG. 5b is a horizontal cross-section view of a portion of the apparatus showing the position of the baffles of FIG. 5a as related to the semiconductor substrate for providing a uniform flow of gas.

Referring next to FIGS. 5a, a top view of the procedure for removing the gas from the chamber without altering the axial symmetry in the vicinity of the substrate 10 is shown. In one embodiment, a plurality of relatively large apertures 53 are located generally equidistant from the axis of symmetry of the gas flow and the gas is removed therethrough. However, this configuration, without additional structure, can cause a large amount of structure in the gas flow in the vicinity of the substrate 10. To reduce this structure, baffles 51 and 52 can be interposed between the substrate and the apertures 53. This structure, in redirecting the flow of the gas, causes a smoothing and, therefore, enhances the axial symmetry of the gas flow. It will be clear that when a multiplicity of apertures 53 extending around the semiconductor substrate can be used, and if the number of these apertures is sufficiently large, the actual departure from axial symmetry in the vicinity of substrate 10 can be minimized even without baffles 51 and 52. FIG. 5b generally is a horizontal partial cross-section view showing the relationship of baffles 52 and 52 and apertures 53 to substrate 10 and susceptor 15.

Operational of the Preferred Embodiment

The chemical vapor deposition of material on the semiconductor substrate is the result of a flow of gas along the surface of the semiconductor substrate 10, the flow of gas being generally constrainted to have axial symmetry. This flow configuration is generally known as stagnation point flow. The density of deposition material carried by the gas and deposited onto the substrate is generally uniform across the entire surface under there conditions. This result is known from the study of this flow configuration in other applications, and these results have been confirmed by computer simulation studies performed by inventors under the conditions determined by the parameters of the deposition reactor. In essence, because of the extending area present in departing from the axis of symmetry, gas containing the original density of deposition materials can come in contact with the surface as a result of both convection and diffusion phenomena. It is further known from studies in other physical areas, and confirmed by computer simulation studies, that the temperature profile of the impinging gas is generally uniform radially. That is, the isotherms over the substrate are a constant distance from the substrate surface. Similarly, for chemical reactions occurring in the gas, the mole fraction of gas components will be generally radially uniform at a given distance from the substrate surface.

Because it is necessary, as a practical matter, to introduce the gas through a series of apertures to establish the required initial conditions, and because of the difficulty in precise centering of the circular semiconductor substrate relative to the entering the departing vapor, the substrate can be rotated to reduce non-uniformity structure in the carrier gas as seen by the substrate.

While the discussion has been directed on the particular gas flow with respect to the substrate, it will be clear that certain other features are significant. For example, if the substrate is to be heated, and particularly if the substrate is to be heated by optical radiation, the apparatus containing the apertures through which the gas is introduced will generally be made of a suitable transparent material, for example, fused quartz. It will also be clear that although the apparatus is shown as having the semiconductor substrate in the horizontal plane with the vapor impinging from above, that this orientation can be varied without altering the operation of the preferred embodiment.

One important aspect of the instant invention is the ability to control the distance as shown in FIG. 4 between the apparatus introducing the gas and the substrate. The ability to determined this distance provides an important tool in controlling the growth of the deposited materials on the substrate 10. The axially symmetric flow of gas (away from the axis) has the important benefit of reducing autodoping by creating a flow of gas in a direction, relative to the substrate, that is opposite from the flow of materials producing the autodoping. This effect can be enhanced and autodopng further reduced, by applying a purge gas to the bottom of the substrate.

This technique of chemical vapor deposition is particularly useful for epitaxial deposition and especially for deposition of epitaxial silicon on a substrate.

The above description is included to illustrate the operation of the preferred embodiment and is not meant to limit the scope of the invention. The scope of the invention is to be limited only by the following claims. Many variations will be apparent to those skilled in the art that would yet be encompassed by the spirit and scope of the present invention.

We claim:

1. Apparatus for deposition of material onto a substrate, comprising:

a circular substrate; and an apparatus for directing a flow of gas carrying a deposition material perpendicular to the circular substrate, said apparatus comprising a member having a plurality of gas flow apertures passing therethrough for maintaining said flow of gas perpendicular to said substrate and creating a stagnation point flow at a center of said circular substrate, said member being disposed parallel to said circular substrate and adapted so that a distance between said apparatus and said circular substrate may be varied, said plurality of gas flow apertures being disposed in a generally circular configuration having a radius substantially equivalent to a radius of said circular substrate wherein said plurality of gas flow apertures and said circular substrate are coaxially aligned such that said flow of gas generally has an axial symmetry with respect to the center of said substrate.

2. The deposition apparatus of claim 1 wherein said substrate can be rotated.

3. The deposition apparatus of claim 1, wherein said flow of gas further comprises chemical vapor deposition materials for epitaxial deposition.

4. The deposition apparatus of claim 3, wherein said gas flow further comprises chemical vapor deposition materials for epitaxial deposition of silicon.

5. The apparatus for deposition of claim 1 further including apparatus for introducing a purge gas on a reverse side of said substrate.

6. Apparatus for chemical vapor deposition of materials on a substrate, comprising:

a substantially circular substrate; and gas flow means having a plurality of apertures passing therethrough and disposed parallel to said substantially circular substrate, said plurality of apertures forming a generally circular configuration having a radius substantially equal to a radius of said substantially circular substrate and coaxially aligned therewith for producing a flow of gas having a substantially uniform magnitude of velocity directed perpendicular to and having axial symmetry across said circular substrate, and maintaining a stagnation flow point at a center of said circular substrate.

7. The apparatus for chemical vapor deposition of claim 6 wherein said gas flow means includes means for varying a distance between said substrate and a region where said gas is directed toward said substrate.

8. The apparatus for chemical vapor deposition of material of claim 6 further including means for rotating said substrate.

9. The apparatus for chemical vapor deposition of claim 6 wherein said gas flow means includes a plurality of apertures for extracting said gas without significantly altering said axial symmetry.

10. The apparatus for chemical vapor deposition of claim 6 further comprising a plurality of baffles between substrate and said extracting apertures.

11. The apparatus for chemical vapor deposition of claim 6 further including means for reducing autodoping of said substrate.

* * * * *